United States Patent [19]

Hynecek

[11] Patent Number: 5,464,996
[45] Date of Patent: Nov. 7, 1995

[54] PROCESS TRACKING BIAS GENERATOR FOR ADVANCED LATERAL OVERFLOW ANTIBLOOMING DRAIN

[75] Inventor: Jaroslav Hynecek, Richardson, Tex.

[73] Assignee: Texas Instruments Incorporated, Dallas, Tex.

[21] Appl. No.: 297,332

[22] Filed: Aug. 29, 1994

[51] Int. Cl.[6] .......................... H01L 29/78; H01L 27/14; H01L 31/00
[52] U.S. Cl. .................. 257/230; 257/223; 257/238; 257/247; 377/59; 348/299; 348/314
[58] Field of Search ................................ 257/223, 230, 257/238, 247; 377/59; 348/299, 314

[56] References Cited

U.S. PATENT DOCUMENTS

| | | | |
|---|---|---|---|
| 4,593,303 | 6/1986 | Dyck et al. | 257/223 |
| 4,679,212 | 7/1987 | Hynecek | 257/230 |
| 4,733,406 | 3/1988 | Kinoshita et al. | 257/230 |
| 5,151,380 | 9/1992 | Hynecek . | |
| 5,291,044 | 3/1994 | Gaboury et al. | 257/223 |
| 5,341,008 | 8/1994 | Hynecek | 257/231 |
| 5,402,459 | 3/1995 | Hynecek | 257/223 |

OTHER PUBLICATIONS

Channel Stop Defined Barrier and Drain Antiblooming Structure for Virtual Phase CCD Image Sensors, W. F. Keenan, et al., IEEE Transactions on Electron Devices, vol. 36, No. 9, Sep. 1989, 1634–1638.

*Primary Examiner*—Ngân V. Ngô
*Attorney, Agent, or Firm*—Alan K. Stewart; Richard L. Donaldson; William E. Hiller

[57] ABSTRACT

The process tracking bias generator for antiblooming structures includes a lateral overflow antiblooming drain and bias circuitry coupled to the antiblooming drain for automatically adjusting a bias for the antiblooming drain independent of process variations.

5 Claims, 3 Drawing Sheets

PROCESS TRACKING BIAS GENERATOR FOR ADVANCED LATERAL OVERFLOW ANTIBLOOMING DRAIN

CROSS-REFERENCE TO RELATED APPLICATIONS

| Ser. No. | Filing Date | TI Case No. |
|---|---|---|
| 08/220,087 | 3/30/94 | TI-19091 |

FIELD OF THE INVENTION

This invention generally relates to image sensor devices, and more particularly relates to charge coupled devices.

BACKGROUND OF THE INVENTION

Without limiting the scope of the invention, its background is described in connection with antiblooming structures for charge coupled device image sensors, as an example. Antiblooming action is important for operation of CCD sensor imaging scenes whose range of illumination intensities greatly exceeds the dynamic range of the sensor. With strong antiblooming action, the optical system can be adjusted for optimum performance at low light levels, and the high overloads associated with the bright portions of the scene can be absorbed by the antiblooming. One type of antiblooming structures is a barrier and drain structure next to or underneath an image sensing pixel. The barrier and drain structure removes any charge in excess of full well.

SUMMARY OF THE INVENTION

Generally, and in one form of the invention, a process tracking bias generator for antiblooming structures includes a lateral overflow antiblooming drain and bias circuitry coupled to the antiblooming drain for automatically adjusting a bias for the antiblooming drain independent of process variations.

This invention provides several advantages. One advantage is that no external antiblooming drain bias is required. A second advantage is that a simple one pulse clear is implemented by coupling the clear signal through a filter capacitor. A third advantage is that no process modification is necessary. All the circuit components are already present in the current virtual phase technology. A fourth advantage is that a simple circuit without external adjustment is an advantage for low cost camera systems.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
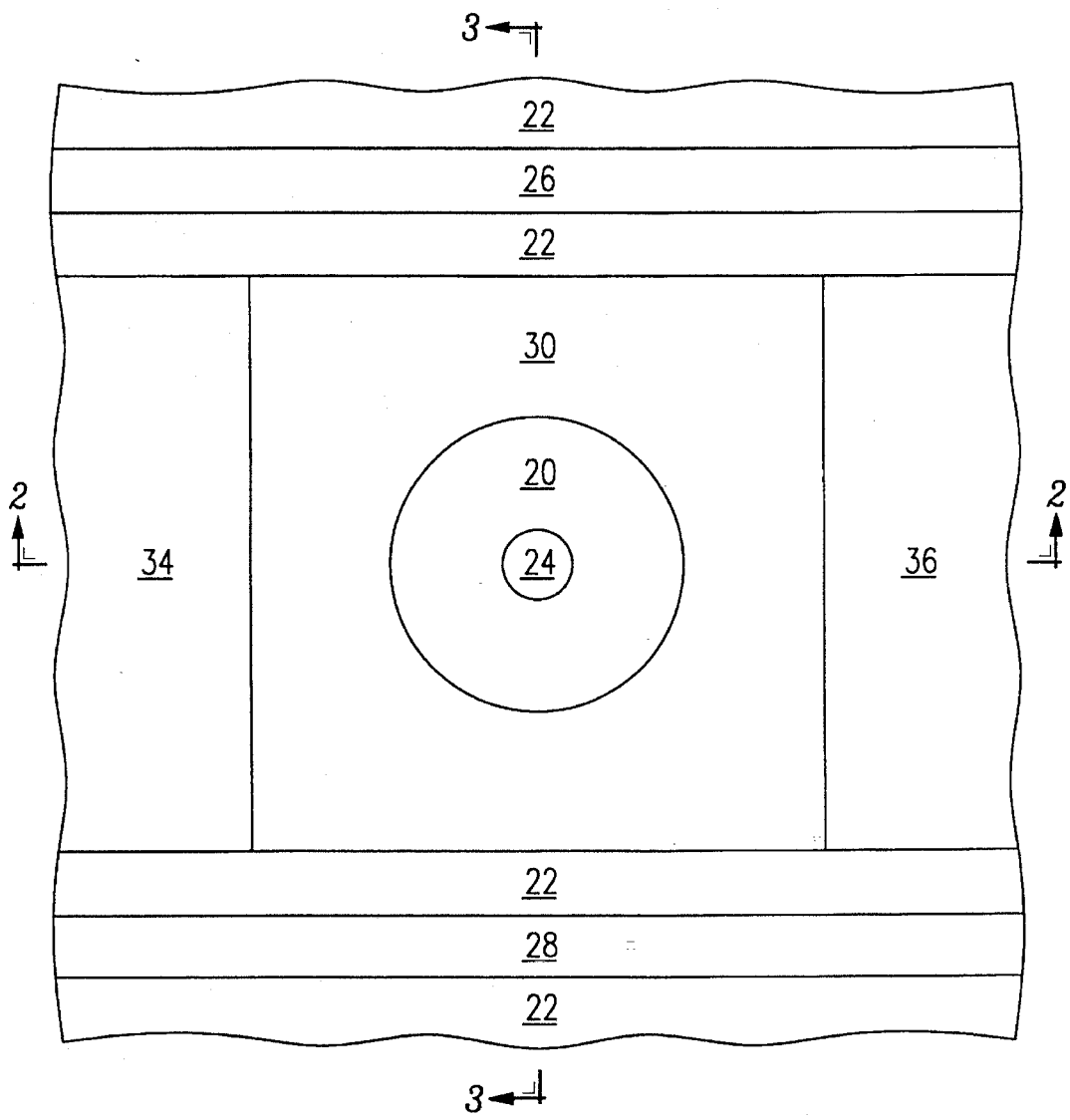
FIG. 1 is a plan view of a dummy lateral overflow drain antiblooming structure.

Referring to FIG. 1, a plan view of a dummy lateral overflow drain antiblooming structure is shown. The antiblooming structure shown in FIG. 1 includes antiblooming gate 20, N type layer 22, N+ drain 24 (charge drain), N+ regions 26 and 28 (charge injection regions), virtual gate 30, and channel stops 34 and 36. The antiblooming structure is formed at a face of a P type semiconductor substrate or layer. The semiconductor layer is preferably a semiconductor substrate, but can take other forms such as an epitaxial layer. The device of FIG. 1 is a dummy structure because an actual lateral overflow drain antiblooming structure would not have N+ regions 26 and 28. The device of FIG. 1 is specifically designed for a process tracking circuit such as the one shown in FIG. 7.

Figure 2:
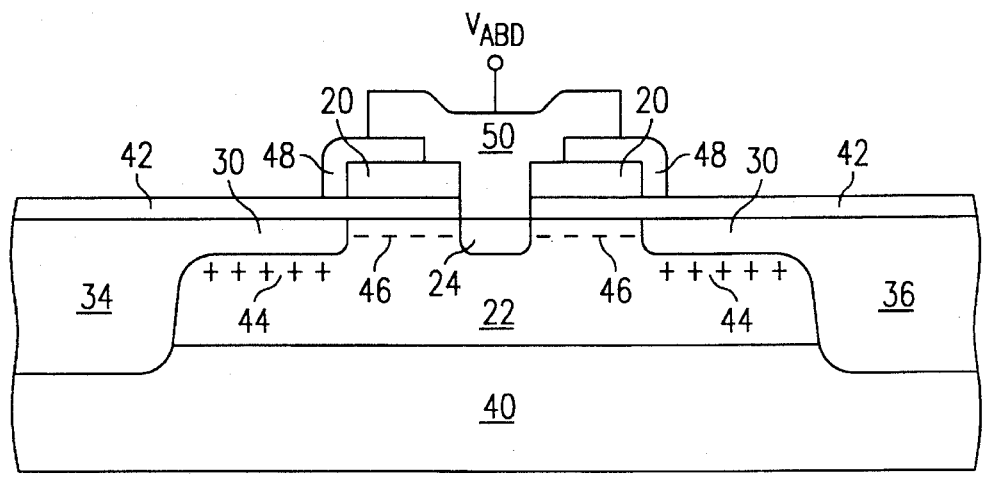
FIG. 2 is a cross-section of the lateral overflow drain antiblooming structure of FIG. 1 through the cross-section A–A'.

FIG. 2 is a cross-section taken along the axis A–A' of the lateral overflow drain shown in FIG. 1. The structure of FIG. 2 includes P type silicon layer 40, N type layer 22 in P type layer 40, P+ virtual gate 30 formed in the upper portion of N type layer 40, N+ drain (lateral drain) 24, gate insulator layer 42, antiblooming gate 20, virtual well donor implants 44 in the N type layer 22, threshold adjust implant (acceptor implants) 46 below the antiblooming gate 20, insulator layer 48, drain interconnect (conductive interconnect) 50, channel stops 34 and 36, and antiblooming drain bias $V_{ABD}$.

Figure 3:
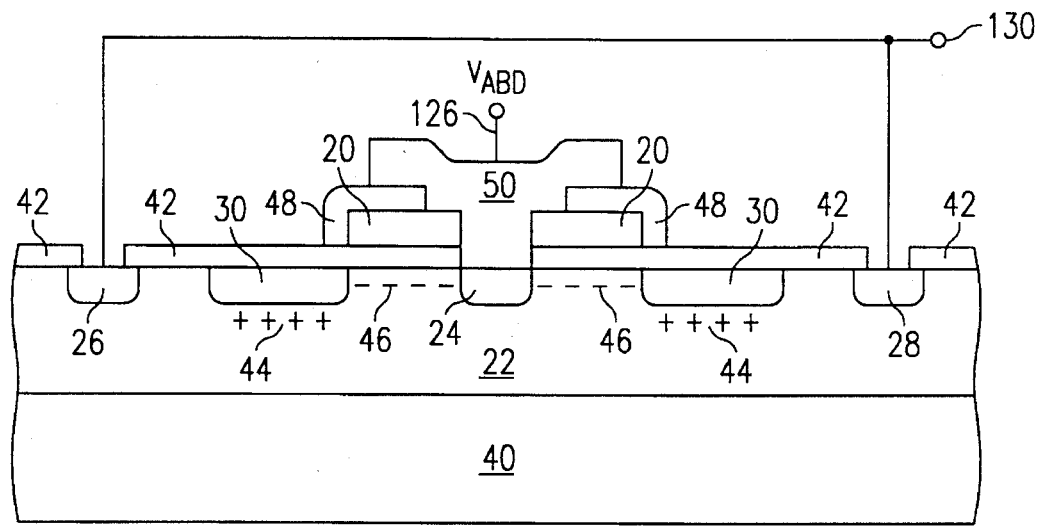
FIG. 3 is a cross-section of the lateral overflow drain antiblooming structure of FIG. 1 through the cross-section B–B'.
Figure 4:
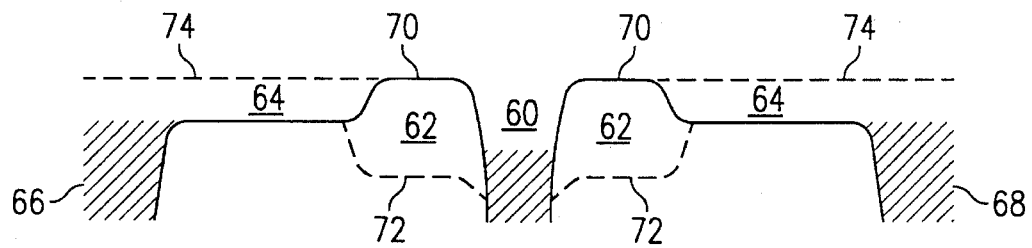
FIG. 4 is a diagram of the potential wells created by the device of FIG. 3.

FIG. 3 is a cross-section taken along the axis B–B' of the lateral overflow drain shown in FIG. 1. FIG. 4 is a corresponding potential diagram of the same cross section. The structure of FIG. 3 includes P type silicon layer 40, N type layer 22 in P type layer 40, P+ virtual gate 30, N+ drain (lateral drain) 24, gate insulator layer 42, antiblooming gate 20, virtual well donor implants 44, threshold adjust implant 46, insulator layer 48, drain interconnect (conductive interconnect) 50, and N+ regions 26 and 28.

The potential diagram of FIG. 4 includes charge drain potential area 60, antiblooming barrier 62 which surrounds the drain potential area 60 in the circular geometry, virtual well 64 which surrounds the antiblooming barrier 62 in the circular geometry, potential regions 66 and 68 below N+ regions 26 and 28, and full well potential level 74 created by a potential on N+ regions 26 and 28.

The device of FIGS. 1, 2, and 3 is a dummy antiblooming drain where charge is supplied to the virtual well 64 by the N+ regions 26 and 28. In an actual antiblooming drain device (not shown) located in an image sensing area, the regions 26 and 28 are not present and charge supplied to the virtual well is generated by incident light. The operation of the dummy device of FIGS. 1, 2, and 3, which is similar to the operation of an actual antiblooming drain, is described below and is illustrated by the potential profile shown in FIG. 4, directly below the corresponding regions of the device of FIG. 3. For antiblooming to be activated, the antiblooming gate 20 is biased such that the potential level 70 of the antiblooming barrier 62 is approximately at the full well potential level 74 of the virtual well 64, as shown in FIG. 4. The bias of the dummy drain will automatically adjust itself to that level if charge is injected from the regions 26 and 28 over the barrier 70 into the drain 60 and when the drain 24 is connected to a charge sinc. The charge sinc provides a high dynamic impedance bias for the drain 24.

Figure 5:
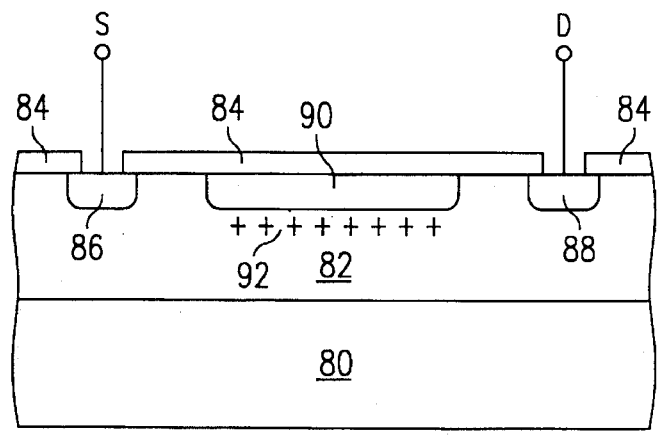
FIG. 5 is a cross-section of a JFET transistor with virtual well donor implants.

FIG. 5 is a cross-section of a JFET transistor with virtual well donor implants. The transistor of FIG. 5 includes P type layer 80, N type layer 82, insulator layer 84, N+ source-drain regions 86 and 88, P+ region 90, and virtual well donor implants 92. The P+ region 90 and donor implants 92 are the same as for the virtual phase charge coupled device virtual gates.

Figure 6:
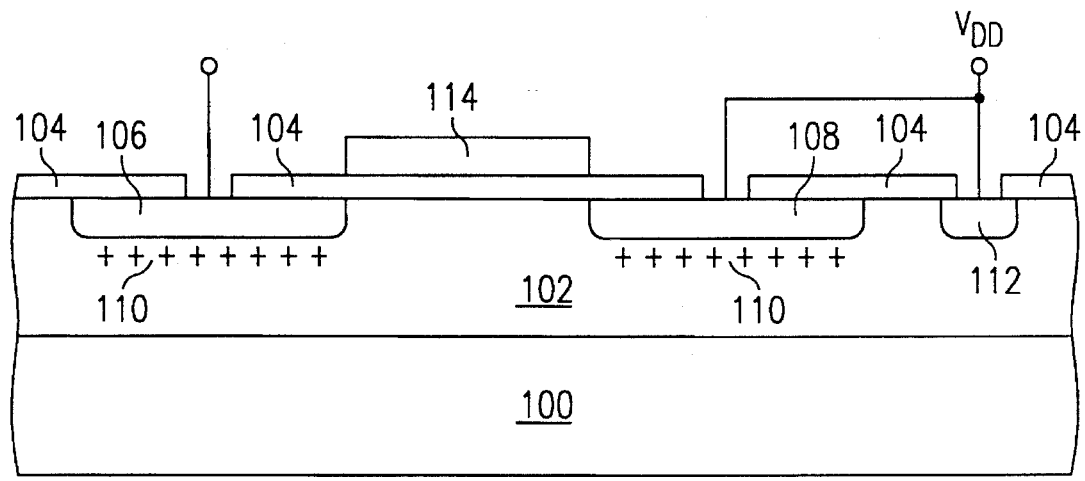
FIG. 6 is a cross-section of a MOSFET transistor with virtual well donor implants.

FIG. 6 is a cross-section of a MOSFET transistor with virtual well donor implants. The transistor of FIG. 6 includes P type layer 100, N type layer 102, insulator layer 104, P+ source-drain regions 106 and 108, donor implants 110, N+ region 112, and transistor gate 114. The P+ regions 106 and 108 and the donor implants 110 are the same as for the virtual phase charge coupled device virtual gates.

Figure 7:
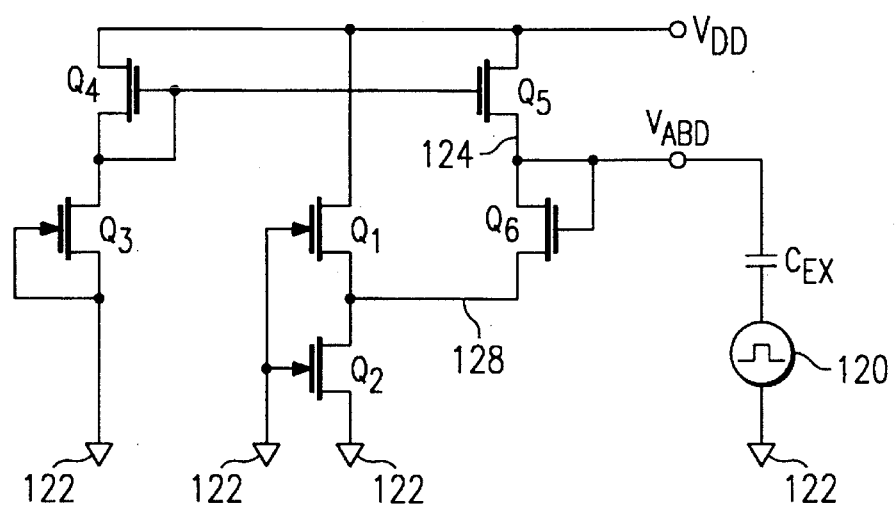
FIG. 7 is a circuit diagram of a preferred embodiment process tracking bias generator for the lateral overflow drain antiblooming structure shown in FIGS. 1–3.

FIG. 7 is a circuit diagram of a preferred embodiment process tracking bias generator for the lateral overflow drain antiblooming structure shown in FIGS. 1–3. The circuit includes JFETs $Q_1$, $Q_2$, and $Q_3$, MOSFETs $Q_4$ and $Q_5$, antiblooming drain transistor $Q_6$, external capacitor $C_{ex}$, external reset generator 120 for supplying the charge clearing pulse to the antiblooming drain, common node 122, and source voltage $V_{dd}$. Transistor $Q_6$ is the antiblooming drain structure shown in FIGS. 1–3. Terminal 124 in FIG. 7 corresponds with terminal 126 of the antiblooming structure in FIG. 3. Terminal 128 in FIG. 7 corresponds with terminal 130 of the antiblooming structure in FIG. 3. Transistor $Q_1$ is a virtual well JFET as shown in FIG. 5. Transistor $Q_2$ is a virtual barrier JFET which is the JFET shown in FIG. 5 without the donor implants 92. Transistor $Q_3$ is also a virtual barrier JFET. Current mirror transistors $Q_4$ and $Q_5$ are P channel MOSFETs as shown in FIG. 6. The donor implants 110 in FIG. 6 are optional for transistors $Q_4$ and $Q_5$.

The circuit of FIG. 7 minimizes external bias adjustments which are required to properly bias the antiblooming drain. The desired bias $V_{ABD}$ is affected by process variations which determine maximum well capacity and the antiblooming overflow barrier 62, shown in FIG. 4. The well potential 64 is determined by the well implants of the virtual phase process. The antiblooming barrier potential 70 is determined by the ion implants and by the antiblooming drain external bias $V_{ABD}$. The bias is adjusted such that when the virtual well 64 is near full (full well potential level 74), charge starts to overflow to drain potential region 60.

The circuit of FIG. 7 is an on-chip circuit which automatically adjusts itself to provide the correct bias $V_{ABD}$ to the antiblooming drains of an image sensor regardless of the process variations. The transistors (JFETs) $Q_1$ and $Q_2$ form a reference bias generator which sets the level of charge in the virtual well 64 at the level (full well potential level 74) which charge overflow into the drain 60 is desired. Since $Q_1$ and $Q_2$ are built from the virtual well and virtual barrier JFETs, as shown in FIG. 5, this level tracks the process variations. The level is set by selecting the sizes of $Q_1$ and $Q_2$. The virtual well JFET $Q_1$ source potential is determined by the virtual well implant 92. A current mirror (current source) is formed by P-channel transistors $Q_4$ and $Q_5$, shown in FIG. 6, which bias the dummy antiblooming drain structure $Q_6$. The amount of current which is chosen to flow through $Q_6$, and therefore over the barrier 70 in FIG. 4, is selected by the size of transistor $Q_3$.

The potential $V_{ABD}$, in FIG. 7, automatically adjusts itself so that a correct level of current selected by $Q_3$ flows through the drain (dummy drain) of $Q_6$. This is independent of process variations, such as variations in the size of the antiblooming drain or barrier implant 46. This bias $V_{ABD}$ is then filtered externally by the capacitor $C_{ex}$ and applied internally to the imager antiblooming drain structures (not shown). The imager clearing pulse from reset generator 120, which provides potential level 72 in FIG. 4, is applied through the $C_{ex}$ external capacitor as shown in FIG. 7. The imager clearing pulse causes charge clearing from the virtual wells in the image area by removing antiblooming potential barrier 70, while in the dummy drain it only causes additional current to flow from regions 26 and 28 to region 24.

This invention provides several advantages. One advantage is that no external $V_{ABD}$ bias is required. A second advantage is that a simple one pulse clear is implemented by coupling the signal through the filter capacitor $C_{ex}$. A third advantage is that no process modification is necessary. All the circuit components are already present in the current virtual phase technology. A fourth advantage is that a simple circuit without external adjustment is an advantage for low cost camera systems.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process tracking bias generator for antiblooming structures comprising:

a lateral overflow antiblooming drain; and bias circuitry coupled to the antiblooming drain for automatically adjusting a bias for the antiblooming drain independent of process variations.

2. The device of claim 1 wherein the lateral overflow antiblooming drain comprises:

a semiconductor region of a first conductivity type;

a drain region of the first conductivity type formed in the semiconductor region;

a threshold adjust region formed in the semiconductor region and surrounding the drain region;

an antiblooming gate surrounding an area above the drain region, the antiblooming gate overlying and separated from at least a portion of the threshold adjust region;

a virtual gate of the second conductivity type in the semiconductor region spaced apart from the drain region and surrounding the drain region; and at least one charge injection region spaced apart from the virtual gate, the virtual gate separates the drain region and the at least one charge injection region.

3. The device of claim 2 further comprising a conductive interconnect coupled to the antiblooming gate and coupled to the drain region.

4. The device of claim 3 wherein the bias circuitry comprises:

a first transistor coupled between a source voltage and the conductive interconnect;

a second transistor coupled between the at least one charge injection region and a common node;
a third transistor coupled between the source voltage and the at least one charge injection region;
a fourth transistor coupled to the common node; and
a fifth transistor coupled between the fourth transistor and the source voltage, a gate of the fifth transistor is coupled to a gate of the first transistor to form a current mirror.

5. A process tracking bias generator for antiblooming structures comprising:

a lateral overflow antiblooming drain having a charge drain, an antiblooming gate, a virtual well, and at least one charge injection node;

a current source coupled to the charge drain and antiblooming gate; and a reference bias generator coupled to the at least one charge injection node.

* * * * *